United States Patent

[11] 3,631,325

[72] Inventor Charles F. Wenz
St. Paul, Minn.

[21] Appl. No. 46,297
[22] Filed June 15, 1970
[45] Patented Dec. 28, 1971

[73] Assignee Sperry Rand Corporation
New York, N.Y.

[54] CARD MODULE AND END WALL TREATMENT FACILITATING HEAT TRANSFER AND SLIDING
2 Claims, 1 Drawing Fig.

[52] U.S. Cl. .......... 317/100, 312/341 NR, 117/132 CF
[51] Int. Cl. .......... H05k 7/20, H05k 1/02
[50] Field of Search .......... 174/117.11, 117.5, 110.6, DIG. 5; 200/166 G; 317/100, 101 DH; 117/132 CF; 312/341 NR

[56] References Cited

UNITED STATES PATENTS

| | | | |
|---|---|---|---|
| 3,547,718 | 12/1970 | Gordon | 174/117 FF |
| 3,057,952 | 10/1962 | Gordon | 174/117.11 |
| 3,382,476 | 5/1968 | Novet | 317/101 DH |
| 3,211,822 | 10/1965 | Krall | 317/100 X |
| 3,492,535 | 1/1970 | Behrendt | 317/100 |
| 3,395,318 | 7/1968 | Laermer | 317/100 |
| 3,258,649 | 6/1966 | Arguin | 317/101 DH |
| 3,212,568 | 10/1965 | Frawley | 317/100 X |

FOREIGN PATENTS

| | | | |
|---|---|---|---|
| 657,085 | 8/1951 | Great Britain | 117/132 CF |

*Primary Examiner*—Lewis H. Myers
*Assistant Examiner*—Gerald P. Tolin
*Attorneys*—Thomas J. Nikolai, Kenneth T. Grace and John P. Dority

ABSTRACT: An electrical packaging arrangement is described wherein individual electrical components are mounted on printed wiring boards with the body of the components in physical contact with heat sink strip members also located on the printed wiring boards. These heat sink strip members terminate at the edge of the board and the board is adapted to be inserted into slots provided in a frame member such that the frame member acts as a heat sink. The invention resides in providing a coating of a material having properties of high thermal conductivity and a low coefficient of friction between the heat sink strips on the edge of the board and the frame member. In practice, it is found that a coating of Teflon between the edge of the boards and the frame member provides excellent results.

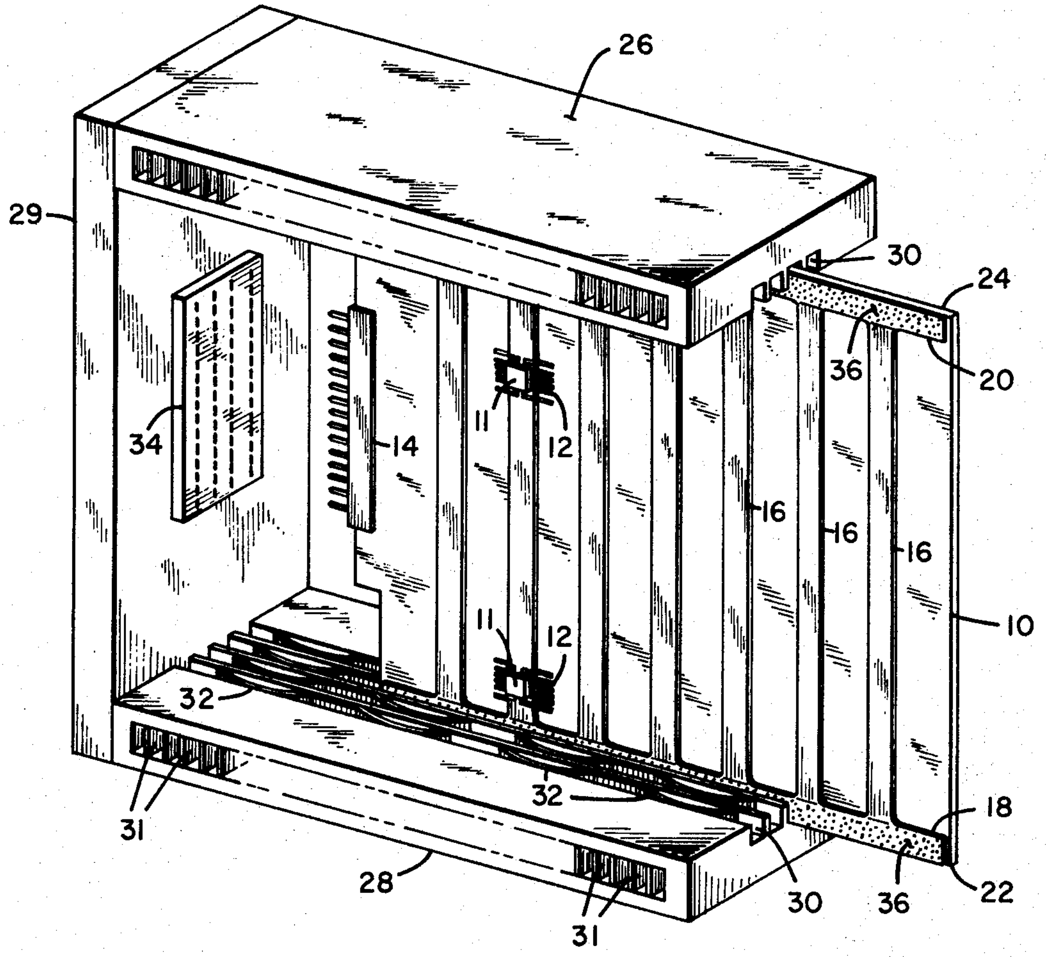
INVENTOR
CHARLES F. WENZ
BY Thomas J. Nikolai
ATTORNEY

CARD MODULE AND END WALL TREATMENT FACILITATING HEAT TRANSFER AND SLIDING

The invention herein described was made in the course of a contract with the Department of the Navy.

BACKGROUND OF THE INVENTION

In the May 15, 1970 edition of EDN magazine at pages 58 and 59, there is described a packaging arrangement for electronic components in which electrical components are mounted on printed wiring boards of the type having a pattern of electrical conductors formed thereon and a heat sink layer disposed on at least one surface of the board. The leads of the electrical components are connected to the printed circuit pattern on the board. The components are in physical contact with the heat sink layer such that the heat energy developed within the compounds is conveyed through the heat sink layer to the edges of the printed wiring board.

The boards themselves may then be mounted in a metallic frame or cabinet such that the edges are inserted in slots provided in the frame. Generally, a spring biasing member is included in slots so that the card members are held in intimate contact with the sides of the slots, thus, heat energy can be conveyed through the frame.

U.S. Pat. No. 3,268,772 shows another arrangement wherein electrical components are mounted upon individual printed wiring boards so as to be in contact with a thermally conductive member and wherein the cards are disposed in slots so that heat energy can be conveyed from the heat sink member through spring-type clamp or slot to an outside frame.

The present invention relates to each of the aforementioned configurations but provides a significant improvement. Specifically, it has been found that the prior art arrangement has a defect in that when cards are repeatedly inserted into and removed from the frame, the edges of the board on which the heat sink is formed wears through abrasion. Because in a typical arrangement this heat sink surface finish may be approximately 0.3 mils thick, it is found that this surface can be completely worn through. Much of this wear is due to the fact that the edges of the printed wiring boards having the heat sink member thereon must be held tightly against the edges of the slots in the frame into which the board is inserted to insure that good thermal conduction to the outside casing can take place.

In the present invention, I obviate this problem by providing a coating of a material having excellent thermal conductance, high electrical resistance and a low coefficient of friction between the heat sink strips on the edges of the board and the sides of the notches in the frame. Because of the low coefficient of friction, the cards are readily inserted into and removed from the frame without undue wear. Because of the high thermal conductance, the heat energy developed in the electrical components can be readily transferred to the outside casing.

According it is an object of the present invention to provide an improved electrical packaging arrangement.

Another object of the invention is to provide a printed wiring board module containing a plurality of printed wiring board slots therein as well as spring members for securely maintaining the printed wiring boards within the slots and in combination therewith a coating between the end wall slot members and the boards.

Still another object of the invention is to provide a modular packaging configuration wherein a coating of polytetrafluorethylene (Teflon) is applied to the portions of the printed wiring board or end wall of the slots into which they are inserted for providing abrasion resistance, electrical insulation and excellent thermal conduction characteristics.

These and other objects of the invention will become apparent from the following specification when considered in light of the accompanying drawing which shows diagrammatically the preferred embodiment of this invention.

Referring now to the drawing, there is shown a printed wiring board 10 having a pattern of electrical conductors formed thereon. The board 10 may be comprised of several layers of insulation and conductors interconnected by means of plated-through holes. The pattern of printed conductors (not shown) are used to interconnect the leads 12 of electrical components together in a predetermined fashion with one another on the board and to external devices through an edge connector 14 mounted on the rear edge of the board 10.

Also mounted on the printed wiring board 10 is a heat sink strip comprised of a plurality of transverse rib member 16 which traverse the card in a first direction and integrally formed portions 18 and 20 which run lengthwise along the edges 22 and 24 of the card 10. The components 11 (only two of which are shown in the drawing) are mounted on the transversely extending thermally conductive ribs 16, so as to be in intimate contact therewith to provide a good heat transfer between the components and the members 16.

A plurality of these boards may then be inserted in a frame member which serves as a cold plate or he at exchanger. The frame member includes a pair of metallic plates 26 and 28 which are fastened to an end plate 29 so as to be maintained parallel to one another. Either the lower plate 28 or the upper plate 26 (not both) may be provided with a plurality of tunnels 31 which extend completely through the plates at right angles to a plurality of grooves or notches 30 formed lengthwise in the members. The notches in member 26 are oppositely disposed to the notches in member 28 so that when a printed wiring board 10 is inserted into a pair of oppositely disposed notches 30, the boar 10 will be at right angles to the members 26 and 28. Adjacent tunnels 31 are separated by a thin wall and in normal usage of the packaging arrangement, air or some other suitable fluid is made to flow through the tunnels to carry heat away from the assembly.

Disposed within each of the slots 30 are one or more spring members 32. These spring members serve to hold the edge portion, 18 and 20 of the heat sink strip and in firm contact with the sidewalls of the notches formed within the members 26 and 28.

When the board 10 is inserted all the way into the assembly, the male pins on edge connector 14 will mate with the female sockets of the connector 34 which is mounted on the end plate 29.

In carrying out the present invention, there is provided a coating of material 36 on the portion of the heat sink strips 18 and 20 which is held in contact with the sidewalls of the notches formed in 26 and 18. In the preferred embodiment of the invention, the material is Teflon and, as such, provides excellent conduction of heat between the heat sink strips 18 and 20 and the sidewalls of the notch 30. Further, Teflon has a low coefficient of friction such that there is only a minimal amount of resistance encountered in the insertion and removal of the board 10 from the frame member comprised of the top and bottom guides 26 and 28 and the end wall 36.

The Teflon material may be applied to the edges of the heat sink members 18 and 20 by spraying the Teflon material through a mask or by dipping. Also, a Teflon strip using an adhesive bond may be used to provide the desired coating on the edges of the printed wiring board 10. Alternatively, in practicing the present invention, it is possible to spray coat the sidewalls of the notches 30 with Teflon rather than coating the strips 18 and 20.

Although the invention has been illustrated and described in detail, it is to be clearly understood that the same is by way of illustration, an example only and is not to be taken by way of limitation, the spirit and scope of this invention being limited only by the terms of the appended claims.

What is claimed is:

1. Apparatus for packaging electronic equipment comprising:

cold plate means comprised of thermally conductive material;

a plurality of spring clip means attached to said cold plate means and spaced at intervals along at least one side thereof;

a plurality of printed wiring board means having a conductive pattern thereon and having a circuit component connected to said conducting pattern;

a metallized layer from on at least one surface of said printed wiring board means in physical contact with said components and extending to and along opposite edges of said board means; and an electrically insulating thermally conductive coating having a low coefficient of friction affixed to said metallized layer along said opposite edges.

2. Apparatus as in claim 1 wherein said coating is polytetrafluoroethylene.

* * * * *

UNITED STATES PATENT OFFICE
CERTIFICATE OF CORRECTION

Patent No. 3,631,325 Dated December 28, 1971

Inventor(s) Charles F. Wenz

It is certified that error appears in the above-identified patent and that said Letters Patent are hereby corrected as shown below:

Column 4, line 5, after "edges" should read -- said board means being inserted into said spring clip means with said coating in contact with said spring clip means --.

Signed and sealed this 17th day of October 1972.

(SEAL)
Attest:

EDWARD M.FLETCHER,JR.
Attesting Officer

ROBERT GOTTSCHALK
Commissioner of Patents